(12) United States Patent
Washizu

(10) Patent No.: US 6,992,576 B2
(45) Date of Patent: Jan. 31, 2006

(54) TEST DEVICE AND TEST MODULE

(75) Inventor: Nobuei Washizu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/930,554

(22) Filed: Aug. 31, 2004

(65) Prior Publication Data

US 2005/0024062 A1    Feb. 3, 2005

Related U.S. Application Data

(63) Continuation of application No. PCT/JP04/06936, filed on May 21, 2004.

(30) Foreign Application Priority Data

May 21, 2003  (JP) .............................. 2003-143725

(51) Int. Cl.
*G08B 29/00* (2006.01)
(52) U.S. Cl. ..................... 340/514; 340/505; 702/108; 702/116; 702/118
(58) Field of Classification Search ................ 340/514, 340/502, 505, 286.02, 679; 702/108, 116, 702/117, 118, 120, 122
See application file for complete search history.

(56) References Cited

U.S. PATENT DOCUMENTS

| | | | |
|---|---|---|---|
| 4,536,703 A * | 8/1985 | Jablway et al. ............. | 324/540 |
| 6,548,910 B2 * | 4/2003 | Kawai ......................... | 257/784 |
| 6,745,140 B2 * | 6/2004 | Sutton .......................... | 702/67 |
| 6,873,927 B2 * | 3/2005 | Chi et al. .................... | 702/117 |
| 6,892,328 B2 * | 5/2005 | Klein et al. .................. | 714/42 |
| 6,895,539 B1 * | 5/2005 | Aragona ...................... | 714/724 |

FOREIGN PATENT DOCUMENTS

| | | |
|---|---|---|
| JP | 5-322978 | 12/1993 |
| JP | 2001-74812 | 3/2001 |

OTHER PUBLICATIONS

Patent Abstracts of Japan, Publication No. 05-322978 dated Dec. 7, 1993, 1 pg.
Patent Abstracts of Japan, Publication No. 2001-074812 dated Mar. 23, 2001, 1 page.
International Search Report issued in PCT/JP2004/006936 and mailed on Aug. 24, 2004, 2 pages.

* cited by examiner

*Primary Examiner*—Daryl C Pope
(74) *Attorney, Agent, or Firm*—Osha•Liang LLP

(57) ABSTRACT

A test device for testing an electronic device having a plurality of device terminals that receive a signal, includes: an operating condition outputting unit for outputting an operating condition indicating an operation of a signal to be supplied to a device terminal to be associated with said device terminal; and a test module for supplying a test signal used in a test of the electronic device to the electronic device based on the operation indicated by the operating condition. The test module includes: a plurality of module terminals, each of which is electrically connected to any of the device terminals, for supplying the test signal to the device terminals, respectively; a terminal correspondence storing unit for storing terminal correspondence information indicating correspondence between each device terminal and a module terminal connected to that device terminal; and an operating setting unit for selecting a module terminal connected to the device terminal associated with the operating condition based on the terminal correspondence information, and setting the operating condition for the selected module terminal.

12 Claims, 10 Drawing Sheets

TEST DEVICE AND TEST MODULE

The present application is a continuation of PCT/JP2004/006936 filed on May 21, 2004 which claims priority from a Japanese Patent Application No. 2003-143725 filed on May 21, 2003, the contents of which are incorporated herein by reference.

FIELD OF THE INVENTION

The present invention relates to a test device capable of testing an electronic device having a plurality of device terminals for receiving a signal. More particularly, the present invention relates to a test device and a test module.

RELATED ART

In a case of simultaneously measuring a plurality of electronic devices, an arrangement is conventionally known in which given input and output terminals of a measuring device are assigned to a given electronic device as disclosed, for example, in Japanese Patent Application Publication (Laid-Open) No. 5-322978, at pages 4–6, FIGS. 1–4. In this measuring device, assignment of the input and output terminals of the measuring device is determined by using a pin definition table for simultaneous measurement that is formed by a register.

However, the conventional pin definition table for simultaneous measurement is formed a plurality of registers, the number of which is equal to the number of the input and output terminals of the measuring devices. Thus, in a case where the measuring device has a large number of input and output terminals, the number of the required registers increases. This may increase the cost of the measuring device.

SUMMARY OF THE INVENTION

Therefore, it is one of the objects of the present invention to provide a test device and a test module, which are capable of overcoming the above drawback accompanying the conventional art. This and other objects can be achieved by combinations described in the independent claims. The dependent claims define further advantageous and exemplary combinations of the present invention.

According to the first aspect of the present invention, a test device for testing an electronic device having a plurality of device terminals that receive a signal, comprises: an operating condition outputting unit operable to output an operating condition indicating an operation of the signal to be supplied to a device terminals to be associated with the device terminal; and a test module operable to supply a test signal used in a test of the electronic device to the electronic device based on the operation indicated by the operating condition, wherein the test module includes: a plurality of module terminals each of which is electrically connected to any of the device terminals, the module terminals being operable to supply the test signal to the device terminals, respectively; a terminal correspondence storing unit operable to store terminal correspondence information indicating correspondence between the device terminals and the module terminals connected to the device terminals, respectively; and an operating setting unit operable to select a module terminal connected to the device terminal associated with the operating condition based on the terminal correspondence information and to set the operating condition for the selected module terminal.

The test device may test a plurality of electronic devices; the operating condition outputting unit may specify an electronic device that is connected to the module terminal for which the operating condition is to be set; the test module may further include an individual device information storing unit operable to store, for each of the plurality of electronic devices, module-terminal information indicating a module terminal connected to that electronic device, and; the operating condition setting unit may select the module terminal that is connected to the device terminal associated with the operating condition in the electronic device specified by the operating condition outputting unit, based on the terminal correspondence information and the module-terminal information, and may set the operating condition for the selected module terminal.

The operating condition outputting unit may output the operating condition to be associated with a terminal group that is a group of a plurality of device terminals; the terminal correspondence storing unit may store information indicating correspondence the terminal group and a module terminal that is connected to a device terminal included in the terminal group as the terminal correspondence information; and the operating condition setting unit may select the module terminal that is connected to the device terminal included in the terminal group associated with the operating condition based on the terminal correspondence information, and, in a case where the selected module terminal is connected to the electronic device specified by the operating condition outputting unit, may set the operating condition for the selected module terminal.

According to the second aspect of the present invention, a test device for testing an electronic device having a plurality of device terminals operable to output signals, comprises: an operating condition outputting unit operable to output an operating condition indicating an expected value of a signal output from a device terminal to be associated with the device terminal; and a test module operable to compare the output signal of the electronic device with the expected value indicated by the operating condition, wherein the test module includes: a plurality of module terminals each of which is electrically connected to any of the device terminals, the plurality of module terminals being operable to input the signals output from the device terminals, respectively; a terminal correspondence storing unit operable to store terminal correspondence information indicating correspondence between each of the device terminals and a module terminal connected to the each device terminal; and an operating condition setting unit operable to select a module terminal that is connected to the device terminal associated with the operating condition based on the terminal correspondence information and to set the operating condition as the expected value of the output signal of the device terminal that is input from the selected module terminal.

Each of device terminals of the electronic device may belong to any of a plurality of domains; and the test device may include the operating condition outputting unit, a plurality of the test modules and a matrix module operable to connect the plurality of test modules; each of the test modules may further include a test unit operable to output a fail signal indicating that the output signal input from the module terminal of that test module is inconsistent with its expected value, to the matrix module. The matrix module may include: a plurality of individual domain aggregating units provided for the plurality of domains, respectively, each individual domain aggregating unit being operable to generate a domain fail signal indicating for at least one module terminal of a corresponding domain the output signal and its expected value are inconsistent with each other, based on the fail signal for each of the module terminals respectively corresponding to the device terminals of the corresponding domain; and a plurality of individual domain distribution units provided for the plurality of domains, respectively, each individual domain distribution unit being operable to distribute the domain fail signal generated by the individual domain aggregating unit of a corresponding domain to each of the test modules connected to the test devices of the corresponding domain.

Each test module may perform a failure process for said electronic device in a domain when receiving said domain fail signal for that domain.

The test unit of each test module may include a plurality of segments each of which outputs the fail signal to the matrix module in a case where for any of two or more module terminals connected to two or more device terminals of the same domain the output signal and its expected value are inconsistent with each other; the individual domain aggregating unit may generate the domain fail signal based on the fail signal input from each of the segments connected to the device terminals of the corresponding domain, and the individual domain distribution unit may distributes the domain fail signal generated by the individual domain aggregating unit corresponding to the corresponding domain to each the segments connected to the device terminals of the corresponding domain.

The test device may test a plurality of electronic devices, and the operating condition outputting unit may specify an electronic device and a domain that are to be tested. The matrix module may include: a segment information storing unit operable to store segment correspondence information indicating correspondence between each of the domains and a segment connected to the device terminal of the each domain; an individual device information storing unit operable to store segment information indicating for each of the plurality of electronic devices a segment to be connected to the each electronic device; and a segment selection unit operable to selects a segment corresponding to the electronic device and the domain that were specified by the operating condition outputting unit, based on the segment correspondence information, that was stored in the segment information storing unit to correspond to the specified domain, and the segment information that was stored in the individual device information storing unit to correspond to the specified electronic device. The individual domain aggregating unit may generate the domain fail signal based on the fail signal input from the segment selected by the segment selection unit, and the individual domain distribution unit may distribute the domain fail signal to the segment selected by the segment selection unit.

According to the third aspect of the present invention, a test device for testing a plurality of electronic devices each having a plurality of device terminals for receiving signals, comprises: an operating condition outputting unit operable to output an operating condition indicating an operation of a test signal used in a test of the electronic devices in a case where the test signal is supplied to a device terminal, while making the operating condition correspond to the device terminal and specifying an electronic device that is to be connected to a module terminal for which the operating condition is set; a plurality of module terminals each of which is electrically connected any of the device terminals, each module terminal supplying the test signal to a corresponding device terminal; a terminal correspondence storing unit operable to store terminal correspondence information indicating correspondence between each of the device terminals and a module terminal to be connected to the each device terminal; an individual device information storing unit operable to store, for each of the plurality of electronic devices, store module-terminal information indicating a module terminal connected to the each electronic device; and an operating condition setting unit operable to select a module terminal that is connected to the device terminal associated with the operating condition in the electronic device specified by the operating condition outputting unit based on the terminal correspondence information and the module-terminal information, and to set the operating condition for the selected module terminal.

According to the fourth aspect of the present invention, a test device for testing a plurality of electronic devices each having a plurality of device terminals for outputting signals, comprises: an operating condition outputting unit for outputting an operating condition indicating an expected value of an output signal output from an electronic device, while making the operating condition correspond to a device terminal and specifying that electronic device that is to be connected to a module terminal for which the operating condition is set; a plurality of module terminals, each of which is electrically connected to any one of the device terminals, for inputting signals output from the device terminals, respectively; a terminal correspondence storing unit for storing terminal correspondence information indicating correspondence between each of the device terminals and a module terminal connected to the each of the device terminals; an individual device information storing unit for storing, for each of the electronic devices, module-terminal information indicating a module terminal to be connected to the each of the plurality of electronic devices; and an operating condition setting unit for selecting the module terminal connected to the device terminal associated with the operating condition in the electronic device specified by the operating condition outputting unit based on the terminal correspondence information and the module-terminal information and for setting the operating condition for the selected module terminal.

According to the fifth aspect of the present invention, a test module for supplying a test signal used in a test of an electronic device having a plurality of device terminals for receiving a signal, to the electronic device, comprises: a plurality of module terminals, each of which is electrically connected to any of the device terminals, for supplying the test signal to the device terminals, respectively; a terminal correspondence storage unit operable to store terminal correspondence information indicating correspondence between each device terminal and a module terminal connected to that device terminal; and an operating condition setting unit operable to receive an operating condition indicating an operation of the test signal that is supplied to the electronic device in such a manner that the operating condition is associated with a device terminal, select a module terminal connected to the device terminal associated with the operating condition based on the terminal correspondence information, and set the operating condition for the selected module terminal.

According to the sixth aspect of the present invention, a test module for comparing an output signal of an electronic device having a plurality of device terminals for outputting signals with an expected value, comprises: a plurality of module terminals, each of which is electrically connected to any of the device terminals, for inputting the signals output from the device terminals, respectively; a terminal correspondence storing unit for storing terminal correspondence information indicating correspondence between each device terminal and a module terminal connected to that device terminal; and an operating condition setting unit for receiving an operating condition indicating the expected value of the output signal of the electronic device in such a manner that the operating condition is associated with a device terminal, selecting a module terminal connected to the device terminal associated with the operating condition based on the terminal correspondence information and setting the operating condition as an expected value of the output signal input from the selected module terminal.

The summary of the invention does not necessarily describe all necessary features of the present invention. The present invention may also be a sub-combination of the features described above.

According to the present invention, a test device can be provided at an appropriate cost.

BRIEF DESCRIPTION OF THE DRAWINGS

FIG. 6 illustrates an exemplary pin map.

FIG. 8 shows an example of individual-device terminal information.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
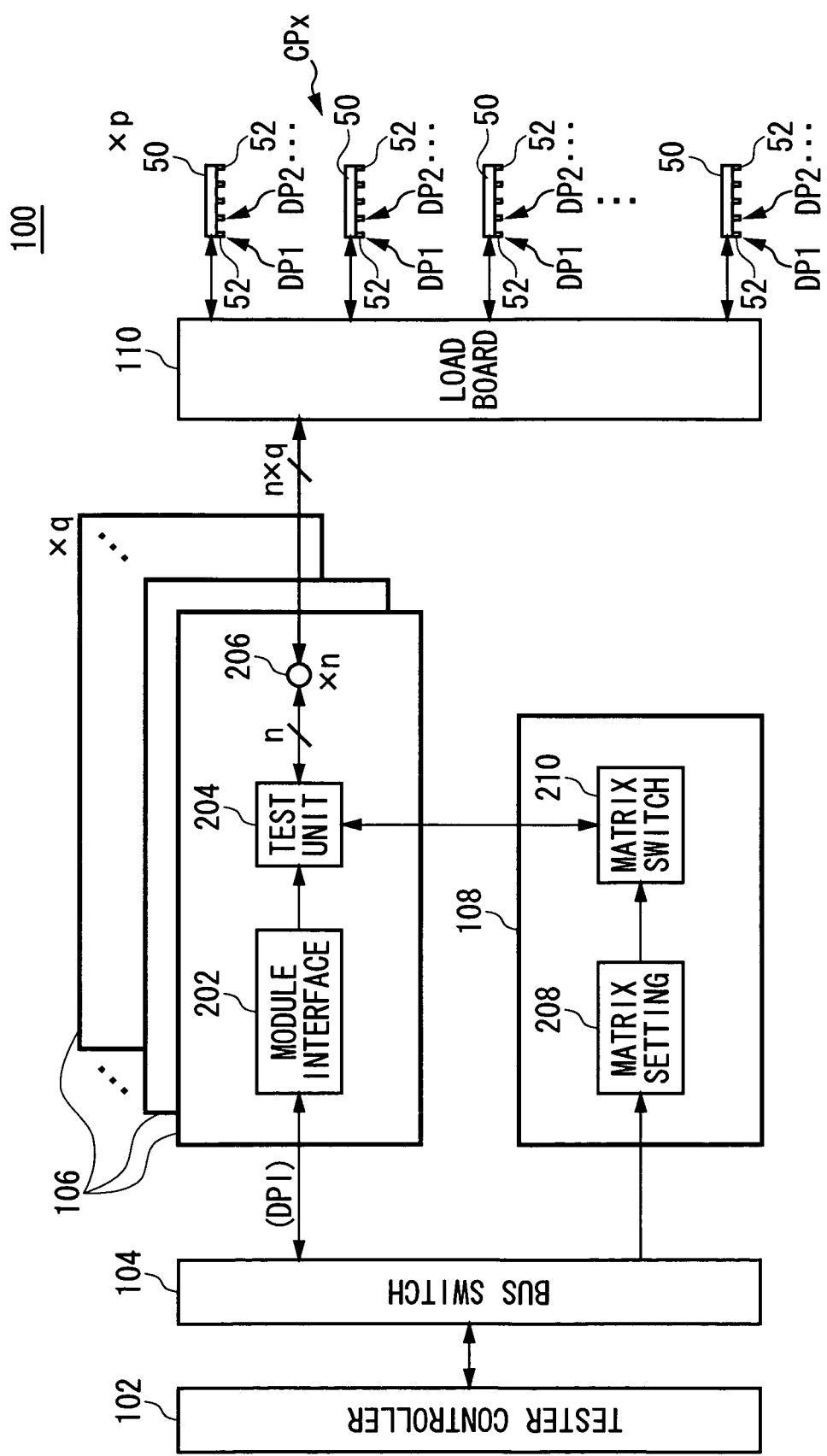
FIG. 1 illustrates an exemplary structure of a test device 100 according to an embodiment of the present invention.

FIG. 1 illustrates an exemplary structure of a test device 100 according to an embodiment of the present invention. This example aims to provide the test device 100 that can efficiently test a plurality of electronic devices 50 as DUTs (Device Under Test) at a low cost.

The electronic device 50 of the present embodiment includes a plurality of device terminals 52. The device terminal 52 is an input and output terminal (device pin) of the electronic device 50, for example. The electronic device 50 may include a plurality of input and output interfaces having different operating frequencies or the like, for example. The test device 100 of the present embodiment aims to test these input and output interfaces in parallel, and has a function of setting a domain corresponding to each of the input and output interfaces and performing a test for each domain. More specifically, the test device 100 sets each of the device terminals 52 of the electronic devices 50 as a terminal belonging to any one of a plurality of domains, and performs a test for each domain independently of other domains.

The test device 100 includes a tester controller 102, a bus switch 103, a plurality of digital module 106, a matrix module 108 and a load board 110.

The tester controller 102 is a CPU for controlling the entire test device 100, for example, and outputs an operating condition indicating an operation such as a timing and/or a level of a signal to be supplied to the device terminal 52 of the electronic device 50, or an operating condition indicating an expected value such as a timing and/or a level of a signal to be output from the device terminal 52. The tester controller 1202 specifies any one of the device terminals 52, for example, based on a program that was set in advance, and outputs the operating condition. In this example, the tester controller 102 outputs information indicating timings of edges of a signal as the operating condition, for example.

The tester controller 102 is an exemplary operating condition outputting unit for outputting an operating condition. The tester controller 102 outputs the operating condition as an exemplary test condition that is to be set to correspond to the device terminal 52. The tester controller 102 may output an operating condition indicating various operations of a signal to be supplied to the electronic device 50 in such a manner that that operating condition corresponds to the device terminal 52.

The bus switch 104 a transmission path for electrically connecting a plurality of digital modules 106 and the matrix module 108 to the tester controller 102. The bus switch 104 supplies the operating condition received from the tester controller 102 to the respective digital modules 106 in parallel.

The matrix module 108 is a test module for electrically connecting a plurality of digital modules 106. In a case where any of the digital modules 106 detected a failure of an electronic device 50 during a test of the electronic device 50, the matrix module 108 notifies each digital module 106 of failure of the test. The matrix module 108 includes a matrix switch unit 210 and a matrix setting unit 208. The matrix switch unit 210 is a switching circuit in form of a matrix and connects the respective digital modules 106 to each other. The matrix switch unit 210 receives a switching control signal for controlling switching of the switching circuit from the matrix setting unit 208 and changes a combination of connected digital modules 106 in accordance with the thus received signal. The matrix setting unit 208 outputs the switching control signal in accordance with an instruction received via the bus switch 104 from the tester controller 102.

The digital module 106 supplies a test signal used in a test of an electronic device 50 to the electronic device 50 and compares an output signal from the electronic device 50 with an expected value. The digital module 106 includes a module interface 202, a test unit 204, and a plurality of module terminals 206. The module interface 202 sets a timing of an operation of the test unit 204, for example, based on the operating condition received from the tester controller 102 via the bus switch 104. For example, the module interface 202 writes data in a per-pin resource, that is provided in the test unit 204 so as to correspond to each of the module terminals 206, while specifying one of the module terminals 206. In this manner, the module interface 202 sets the timing for the specified module terminal 206. The module interface 202 may set a level of a signal output from the test unit 204 based on the operating condition. Moreover, the module interface 202 may set an expected value of a signal level to be compared with an output signal output from the electronic device 50 based on the operating condition.

The test unit 204 is a pin electronics circuit including a driver circuit for outputting a test signal and a comparator circuit for receiving an output signal of the electronic device 50, and is electrically connected to the electronic device 50 via the module terminal 206 and the load board 110. Then, the test unit 204 outputs the test signal based on the operating condition set by the module interface 202. In addition, the test unit 204 receives the output signal of the electronic device 50 and compares that output signal with the expected value indicated by the operating condition.

In this example, the test unit 204 is electrically connected to another test unit 204 provided in another test module 106 via the matrix switch unit 210. The test unit 204 supplies a signal based on the output signal of the electronic device 50, for example, to the other test unit 204 via the matrix switch unit 210. More specifically, the test unit 204 outputs a fail signal that indicates inconsistence between the output signal of the electronic device 50 that is input from the module terminal 206 included in the corresponding digital module 106 and the expected value for that module terminal 206, to the matrix module 108 and supplies the fail signal to the other test unit 204 via the matrix module 108.

A plurality of module terminals 206 are input and output terminals (tester pins) of the test device 100. Each of the module terminals 206 is electrically connected to any one of the device terminals 52 via the load board 110 that is an exemplary connection unit such as a performance board, for example. Each module terminal 206 supplies a test signal received from the test unit 204, to the device terminal 52 connected thereto. In this case, the module terminal 206 outputs the test signal at a timing that is set in the test unit 204 based on the operating condition, for example. Each module terminal 206 inputs an output signal output from the device terminal 52 connected thereto. In this case, the digital module 106 compares the output signal input to each module terminal 206 with an expected value indicated by the operating condition set by the tester controller 102. According to this example, the operating condition for signal input to and signal output from the electronic device 50 can be set in an appropriate manner. Moreover, due to this, timings of the signal input and signal output of the electronic device 50 can be set in an appropriate manner.

Next, an operation of the test device 100 is described in more detail. In this example, the test device 100 tests p electronic devices 50 in parallel. These electronic devices 50 are the same kind of LSI and each electronic device 50 has a plurality of device terminals 52. In the respective electronic devices 50, these device terminals 52 are specified by common device terminal numbers, such as DP1, DP2, . . . . At least a part of these device terminals 52 receive a test signal from the test device 100. Moreover, at least a part of these device terminals 52 output signals in accordance with the test signal from the test device 100.

The test device 100 includes q digital modules 106 that have the same or similar function and structure. Each digital module 106 has n module terminals 206. Thus, the test device 100 has n×q module terminals 206. At least a part of these module terminals 206 are electrically connected to a plurality of device terminals 52 included in the p respective electronic devices 50. Please note that p, q and n are integers that is one or more, i.e., any of 1, 2, 3, . . . .

For example, in a case where the tester controller 102 specified a DP1-th device terminal 52 and outputted an operating condition, q module interfaces 202 and q test units 204 that are respectively provided in q digital modules 106 set the operating condition for a module terminal 206 that is connected to the DP1-th device terminal 52. In this case, the module interface 202 and test unit 204 set the operating condition for p module terminals 206 that correspond to DP1-th device terminals 52 respectively included in p electronic devices 50.

In this case, the q digital modules 106 expand and process an operating condition that was output to correspond to the device terminal 52 in parallel, and set the operating condition of the module terminal 206 corresponding to that device terminal 52. Thus, according to this example, the tester controller 102 can broadcast and write data indicated by the operating condition for a plurality of digital modules 106 in an appropriate manner.

The tester controller 102 may specify the electronic device 50 that is to be connected to the module terminal 206 for which an operating condition is to be set, so as to output the operating condition. For example, the tester controller 102 specifies a CPx-th one of p electronic devices 50 and outputs an operating condition that is associated with a DP1-th device terminal 52. In this case, the module interface 202 and the test unit 204 set the operating condition for a module terminal 206 that is connected to the DP1-th device terminal 52 in the CPx-th electronic device 50.

The tester controller 102 may output an operating condition in such a manner that it corresponds to a terminal group (pin group) that is a group of a plurality of device terminals 52. For example, the tester controller 102 outputs an operating condition so as to correspond to a terminal group including DP1-th, DP3-th, and DP7-th device terminals 52. In this case, the module interface 202 and the test unit 204 sets the operating condition for module terminals 206 that are connected to these three types of device terminal 52 in each electronic device 50. In this case, it is also possible to set the operating condition for the module terminals 206 in an appropriate manner.

Figure 2:
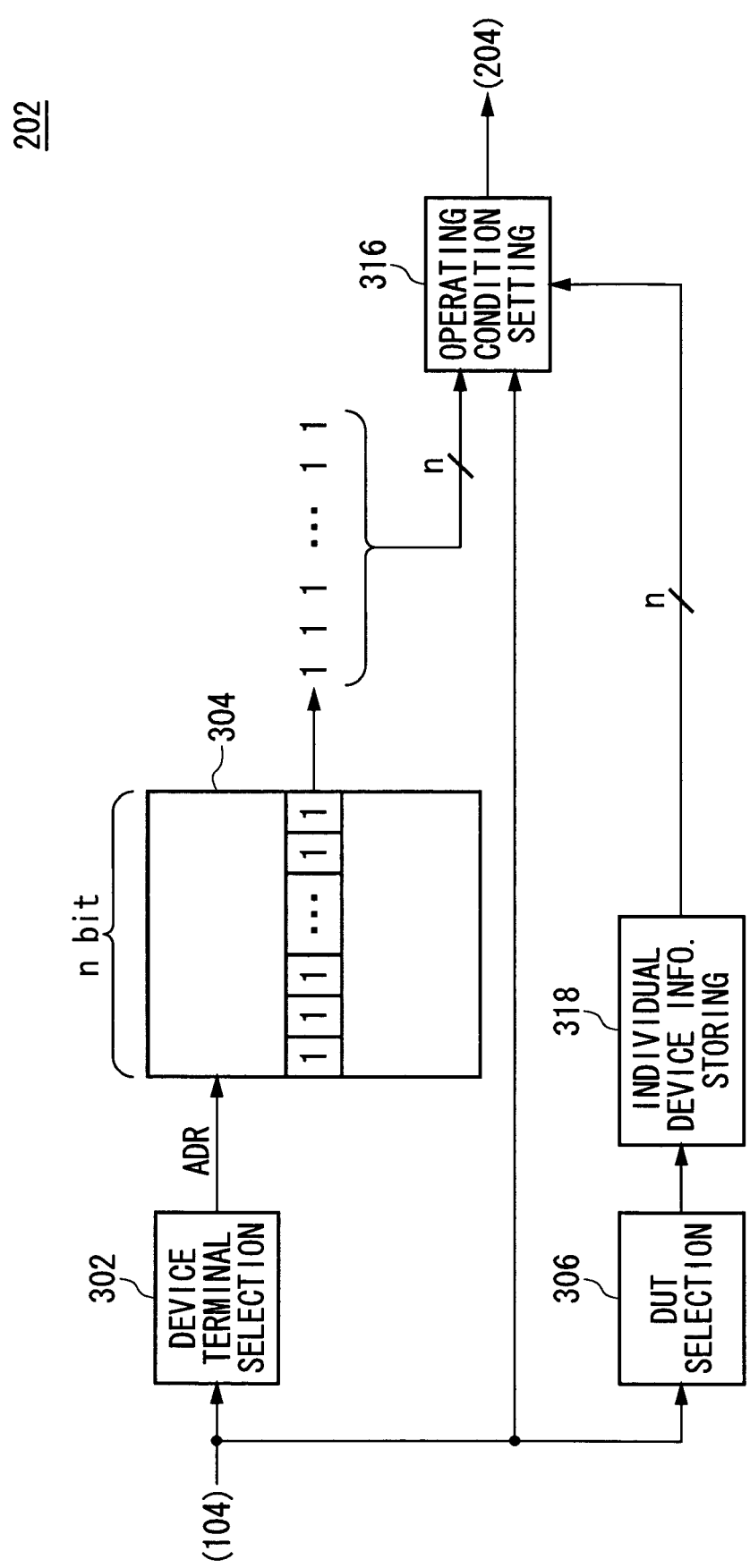
FIG. 2 illustrates an exemplary structure of a module interface 202.

FIG. 2 illustrates an exemplary structure of the module interface 202. The module interface 202 includes a device terminal selection unit 302, a terminal correspondence storing unit 204, a DUT selection unit 306, an individual device information storing unit 318 and an operating condition setting unit 316.

The device terminal selection unit 302 is an address decoder that outputs an address specifying data stored in the terminal correspondence storing unit 304, and stores in advance correspondence between each of a plurality of device terminals 52 (see FIG. 1) and an address to be output so as to correspond to that device terminal. Based on the operating condition received from the tester controller 102 (see FIG. 1) via the bus switch 104, the device terminal selection unit 302 supplies the address corresponding to the device terminal 52 that corresponds to the received operating condition, to the terminal correspondence storing unit 304. In this manner, the device terminal selection unit 302 selects the device terminal 52 corresponding to the operating condition and outputs data that is associated with the selected device terminal 52 to the terminal correspondence storing unit 304.

In this example, the device terminal selection unit 302 further stores correspondence between a terminal group and an address, and, in a case where the tester controller 102 output an operating condition so as to correspond to a terminal group, supplies the address corresponding to that terminal group to the terminal correspondence storing unit 304.

The terminal correspondence storing unit 304 is a memory for storing terminal correspondence information that indicates each device terminal 52 and a module terminal 206, as shown in FIG. 1, connected to that device terminal 52. In this example, the terminal correspondence storing unit 304 stores a pin map that is information indicating the aforementioned correspondence between device terminals 52 and the module terminals 206 as a part of the terminal correspondence information. The terminal correspondence storing unit 304 stores, at an address that was associated with each device terminal 52 in advance, data indicating a module terminal 52 that is connected to that device terminal 52. Then, the terminal correspondence storing unit 304 receives an address associated with any of the device terminal 52 from the device terminal selection unit 302, and outputs data indicating a module terminal 206 that is connected to that device terminal 52 based on the pin map in accordance with the received address.

In the present example, the terminal correspondence storing unit 304 stores, for n module terminals 206 provided in each digital module 106 (see FIG. 1), n-bit data in which n bits are associated with the n module terminals 206, respectively, at addresses corresponding to the n module terminals 206. The terminal correspondence storing unit 304 stores at each address a value "1" in a bit representing a module terminal 206 that is connected to a device terminal 52 corresponding to that address.

The terminal correspondence storing unit 304 further stores a pin group map that is information indicating correspondence each terminal group and module terminals 206 connected to device terminals 52 included in that terminal group, as a part of the terminal correspondence information. In a case where the terminal correspondence storing unit 304 received an address corresponding to a terminal group from the device terminal selection unit 302, the terminal correspondence storing unit 304 outputs data indicating module terminals 206 corresponding to that terminal group based on the pin group map. In an alternative example, the terminal correspondence storing unit 304 may be a register. Moreover, the terminal correspondence storing unit 304 may include a plurality of memories each stores a pin map or a pin group map.

In the present embodiment, the terminal group may be a group of a plurality of device terminals 52 that belong to one or more domains. It is more preferable that the terminal group be a group of all device terminals 52 that belong to one or more domains. Thus, the tester controller 102 can set a common operating condition for all the device terminals 52 that belong to one or more domains included in a certain terminal group by outputting the operating condition in such a manner that the operating condition is associated with that terminal group. On the other hand, the tester controller 102 can individually set an operating condition for each device terminal 52 by outputting the operating condition in such a manner that the operating condition is associated with that device terminal 52. Therefore, the test device 100 can set the operating condition at a high speed by setting the common operating condition for all the device terminals 52 in the same terminal group and then setting the operating condition for each device terminal 52 individually.

The DUT selection unit 306 is a register for selecting a part or all of p electronic devices 50 (see FIG. 1) in accordance with an instruction from the tester controller 102. The DUT selection unit 306 supplies a signal indicative of the selected electronic device 50 to the individual device information storing unit 318. For example, in a case where the tester controller 102 output an operating condition while specifying any of the electronic devices 50, the DUT selection unit 306 outputs a signal indicative of the specified electronic device 50.

The individual device information storing unit 318 stores module-terminal-for-individual-device information indicating, for each of a plurality of electronic devices 50, terminal devices 206 connected to that electronic device 50. The individual device information storing unit 318 also supplies a signal indicative of module terminals 206 connected to an electronic device 50 that was selected by the DUT selection unit 306 to the operating condition setting unit 316 based on the module-terminal-for-individual-device information.

The operating condition setting unit 316 receives a signal based on the pin map from the terminal correspondence storing unit 304 and also receives a signal based on the module-terminal information from the individual device information storing unit 318. The operating condition setting unit 316 then selects a module terminal 206 in the electronic device 50 specified by the tester controller 102, that is connected to the device terminal 52 associated with the operating condition. In this manner, the operating condition setting unit 316 selects that module terminal 206 based on the pin map and module-terminal information.

The operation condition setting unit 316 supplies the signal indicative of the selected module terminal 206 and the operating condition received from the tester controller 102 via the bus switch 104, to the test unit 204, thereby making the test unit 204 set the operating condition for that module terminal 206. In this manner, the operating condition setting unit 316 sets a timing, for example, for the module terminal 206 that was selected to correspond to the device terminal 52 to which a test signal is to be supplied, based on the operating condition. Moreover, the operating condition setting unit 316 sets the operating condition for the module terminal 206 that was selected to correspond to the device terminal 52 that is to output a signal, as an expected value of an output signal input from that module terminal 206.

In a case where the selected module terminal 206 is a module terminal 206 that is connected to the electronic device 50 spe4cified by the tester controller 102, the operating condition setting unit 316 may set the operating condition for that module terminal 206. Moreover, the operating condition setting unit 316 may select a module terminal 206 that is connected to the device terminal 52 included in the terminal group associated with the operating condition based on the group map. According to this example, it is possible to select the module terminal 206 in an appropriate manner and set the operating condition for the selected module terminal 206 in an appropriate manner.

The module interface 202 may select the module terminal 206 that is connected to a particular electronic device 50 based on the module-terminal information, for example, so as to enable or disable that module terminal 206. Thus, the module interface 202 may electrically disconnect the electronic device 50 that failed the test from the test device 100. According to this example, it is possible to test a plurality of electronic devices 50 with high degree of freedom by appropriately selecting a device terminal 52 that is connected to each electronic device 50.

If the terminal correspondence storing unit 304 were provided in the tester controller 102, for example, the terminal correspondence storing unit 304 may be required to have a storage capacity in accordance with the possible largest number of module terminals 206 that can be mounted in the test device 100. This increases the cost of the test device 100. However, according to this example, the terminal correspondence storing unit 304 having the storage capacity in accordance with the number of the module terminals 206 that are provided in the test device 100. Thus, according to this example, excess increase of the cost of the test device 100 can be prevented. Therefore, it is possible to provide the test device 100 at an appropriate cost.

Figure 3:
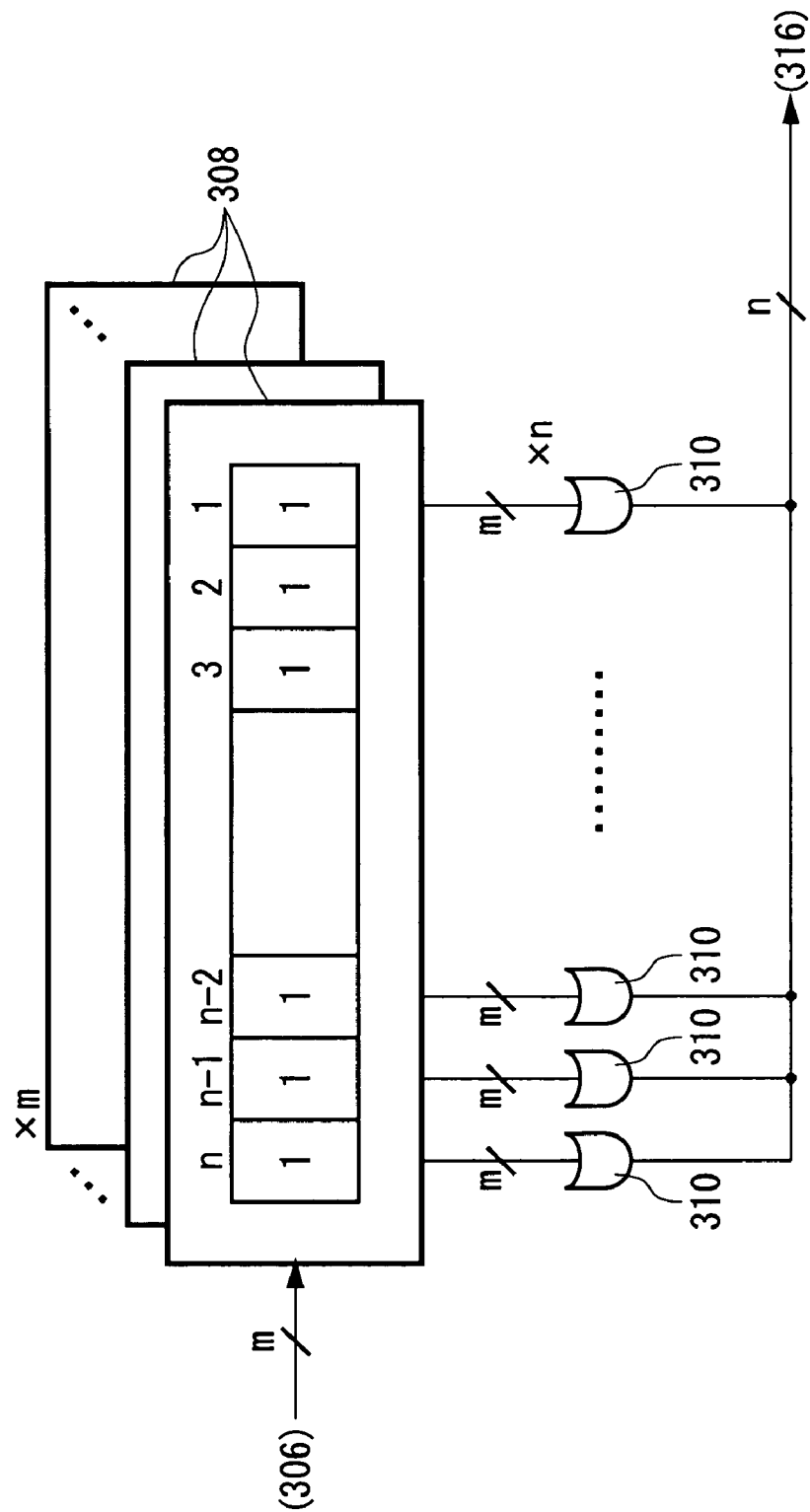
FIG. 3 illustrates an exemplary structure of an individual device information storing unit 318.

FIG. 3 illustrates an exemplary structure of the individual device information storing unit 318. The individual device information storing unit 318 includes a plurality of DUT map registers 308 and a plurality of OR circuits 310. In this example, the individual device information storing unit 318 has m DUT map registers 308, wherein m is larger than the number p of the electronic devices 50 (see FIG. 1). The individual device information storing unit 318 receives a m-bit signal from the DUT selection unit 306 as information indicating the electronic device 50 specified by the tester controller 102 (see FIG. 1). In the m-bit signal, m bits correspond to the m DUT map registers 308, respectively.

The p DUT map registers of the m DUT map registers 308 are made to correspond to p electronic devices 50. When being made to correspond to any one of the electronic devices 50, the DUT map register 308 stores information indicating a module terminal 206 that is connected to that electronic device 50. The DUT map register 308 stores n-bit data as module-terminal information so as to correspond to n module terminals 206, n bits of the data corresponding to the n module terminals 206, respectively.

The DUT map register 308 stores a value "1! in the bit representing the module terminal 206 connected to the corresponding electronic device 50, for example. Thus, each DUT map register 308 stores module-terminal information associated with the corresponding electronic device 50. The DUT map register 308 corresponding to the electronic device 50 specified by the tester controller 102 supplies n-bit module-terminal information stored therein to n OR circuits 310.

The n OR circuits 310 are provided to correspond to n module terminals 206, respectively, and each OR circuit 310 receives a bit associated with the corresponding module terminal 206 from each DUT map registers 308. Then, each OR circuit 310 supplies a logical sum of the bits received from the respective DUT map registers 308 to the operating condition setting unit 316.

Thus, the OR circuit 310 supplies a signal indicating whether or not the corresponding module terminal 206 is connected to the electronic device 50 specified by the tester controller 102, to the operating condition setting unit 316. Moreover, the individual device information storing unit 318 also supplies an n-bit signal indicating the module terminal 206 to be connected to the electronic device 50 specified by the tester controller 102, to the operating condition setting unit 316. In an alternative example, the individual device information storing unit 318 may include a memory for storing module-terminal information in place of the DUT map register 308.

Figure 4:
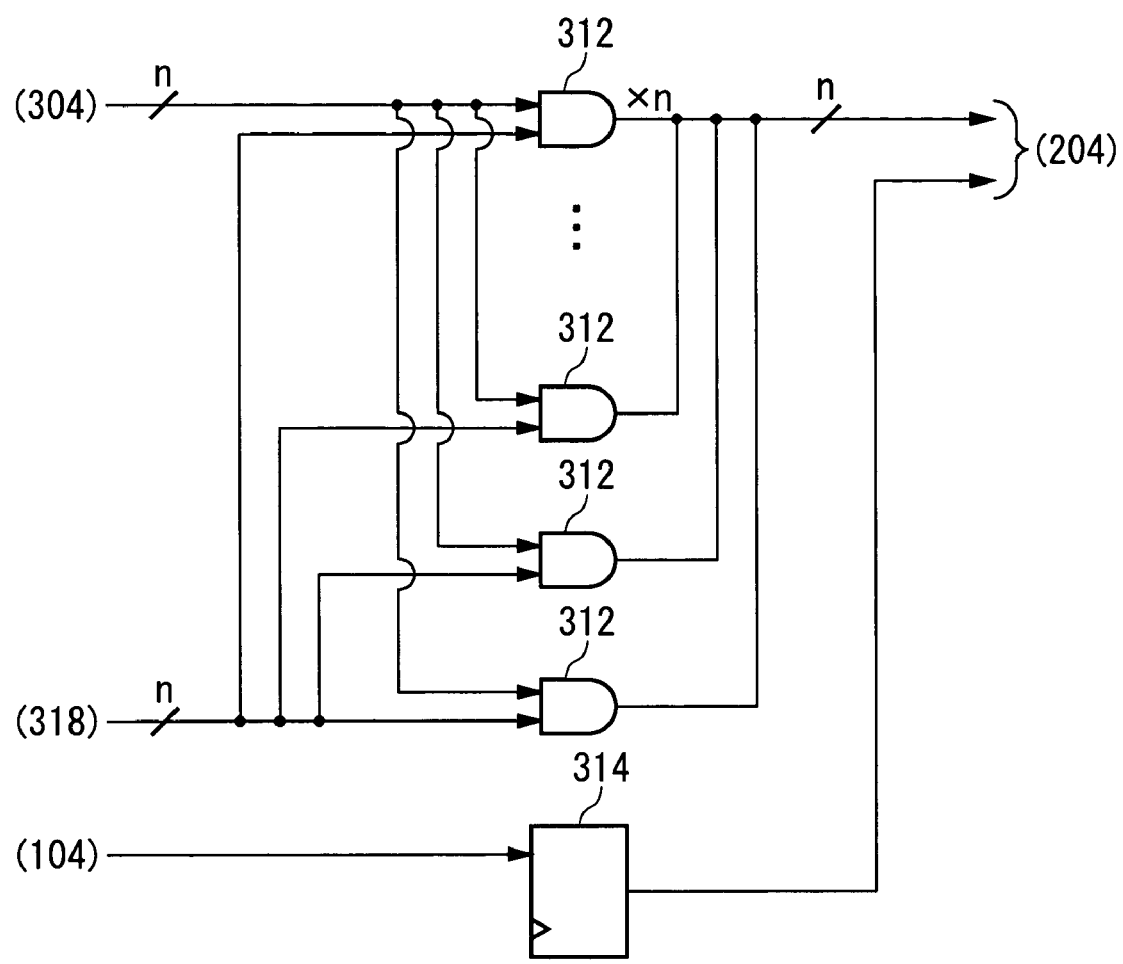
FIG. 4 illustrates an exemplary structure of an operating condition setting unit 316.

FIG. 4 illustrates an exemplary structure of the operating condition setting unit 316. The operating condition setting unit 316 includes a data register 314, and n AND circuits 312 provided to correspond to n module terminals 206 (see FIG. 1). The data register 314 is a flip-flop, for example, and latches the operating condition received from the tester controller 102 via the bus switch 104 at its one end and supplies the operating condition to the test unit 204 at a predetermined timing.

The n AND circuits 312 obtain logical products (ANDs) of signals received from the terminal correspondence storing unit 304 and the individual device information storing unit 318 bit for each bit and output the logical products to the test unit 204. Thus, the operating condition setting unit 316 selects the module terminal 206, that is connected to the device terminal 52 (see FIG. 1) associated with the operating condition, in. the electronic device 50 (see FIG. 1) specified by the tester controller 102, and outputs a signal indicating the selected module terminal 206 to the test unit 204. According to this example, it is possible to appropriately select the module terminal 206.

Figure 5:
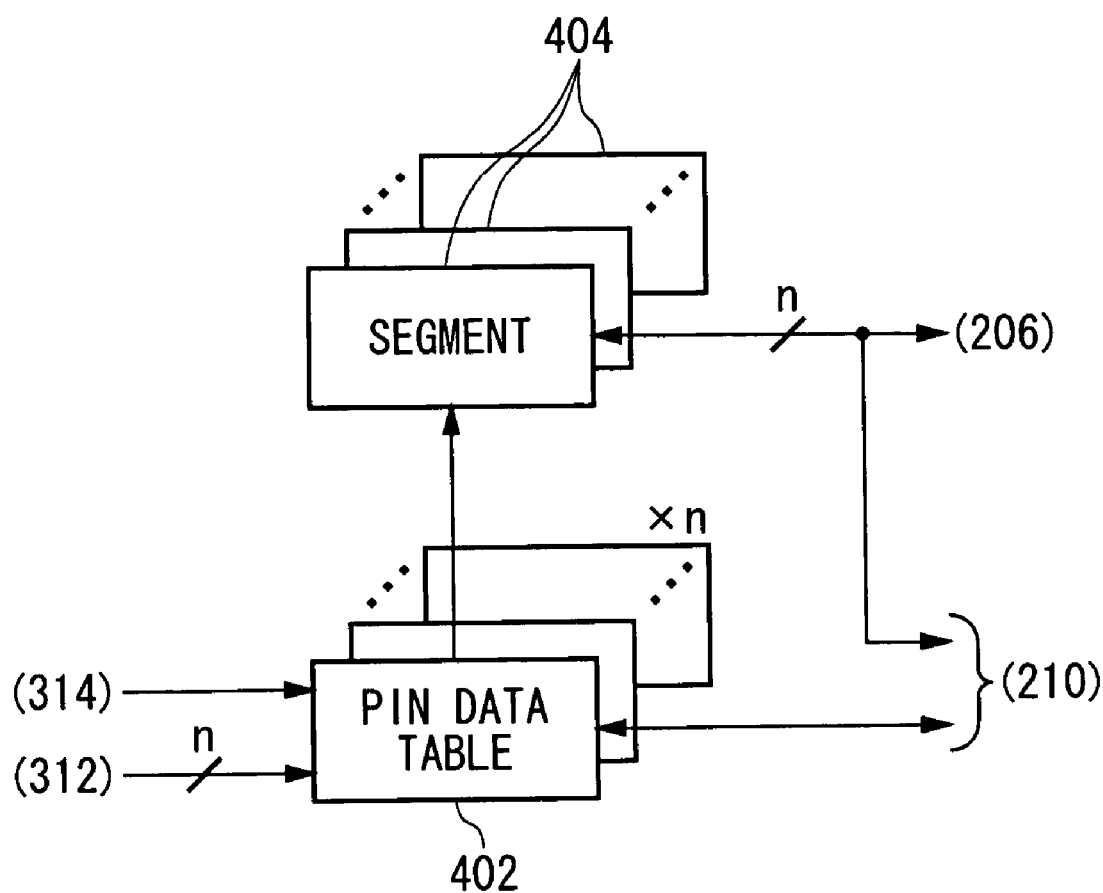
FIG. 5 illustrates an exemplary structure of a test unit 204.

FIG. 5 illustrates an exemplary structure of the test unit 204. The test unit 204 includes n pin data tables 402 that are provided to correspond to n module terminals 206 (see FIG. 1), and a plurality of segments 404.

The pin data table 402 is a register for setting an operating condition for the corresponding module terminal 206. Based on an n-bit signal received from the operating condition setting unit 316, each pin data table 402 stores data indicated by a signal received from the data register 314 in a case where the corresponding module terminal 206 is selected. Thus, the pin data table 402 sets the operating condition for the corresponding module terminal 206. According to this example, it is possible to set an operating condition for each module terminal 206 in an appropriate manner.

Moreover, in this example, the pin data table 402 enables or disables the corresponding module terminal 206 in accordance with a fail signal received from the matrix switch unit 210. For example, in a case where any of the electronic devices 50 failed the test, the pin data table 402 disables the module terminal 206 that is connected to that electronic device 50 in accordance with an instruction from the matrix switch unit 210.

Each segment 404 is provided to correspond to a predetermined number of module terminals 206, and controls signal input and output in the corresponding module terminals 206. In the present embodiment, the segment 404 controls signal input and output in one or more module terminals 206 connected to one or more device terminals 52 that belong to the same domain in the same electronic device 50. The segment 404 includes a driver and a comparator that are electrically connected to the corresponding module terminal 206, and allows that module terminal 206 to input and output a signal to/from the electronic device 50 (see FIG. 1).

In this example, the segment 404 is electrically connected to the matrix switch unit 210 and, in a case where for at least one or more module terminals 206 connected thereto, an output signal of the electronic device 50 input from that module terminal 206 is not coincident with the expected value, outputs a fail signal to the matrix module 108. In accordance with the thus output signal, the matrix switch unit 210 controls the test unit 204 provided in another digital module 106 (see FIG. 1), for example.

In the above description, module terminals 206 corresponding to one segment 404 are electrically connected to device terminals 52 that belong to the same domain in the same electronic device 50. Thus, the segment 404 determines the minimum division unit in assignment when module terminals 206 are connected to electronic devices 50. In this case, by managing the assignment of the module terminals 206 on the segment 404 basis, resource required for managing the assignment can be reduced.

Each segment 404 may be provided to correspond to one module terminal 206, for example. In this case, it is possible to assign each module terminal 206 to a plurality of electronic devices 50 with high degree of freedom.

Figure 6:
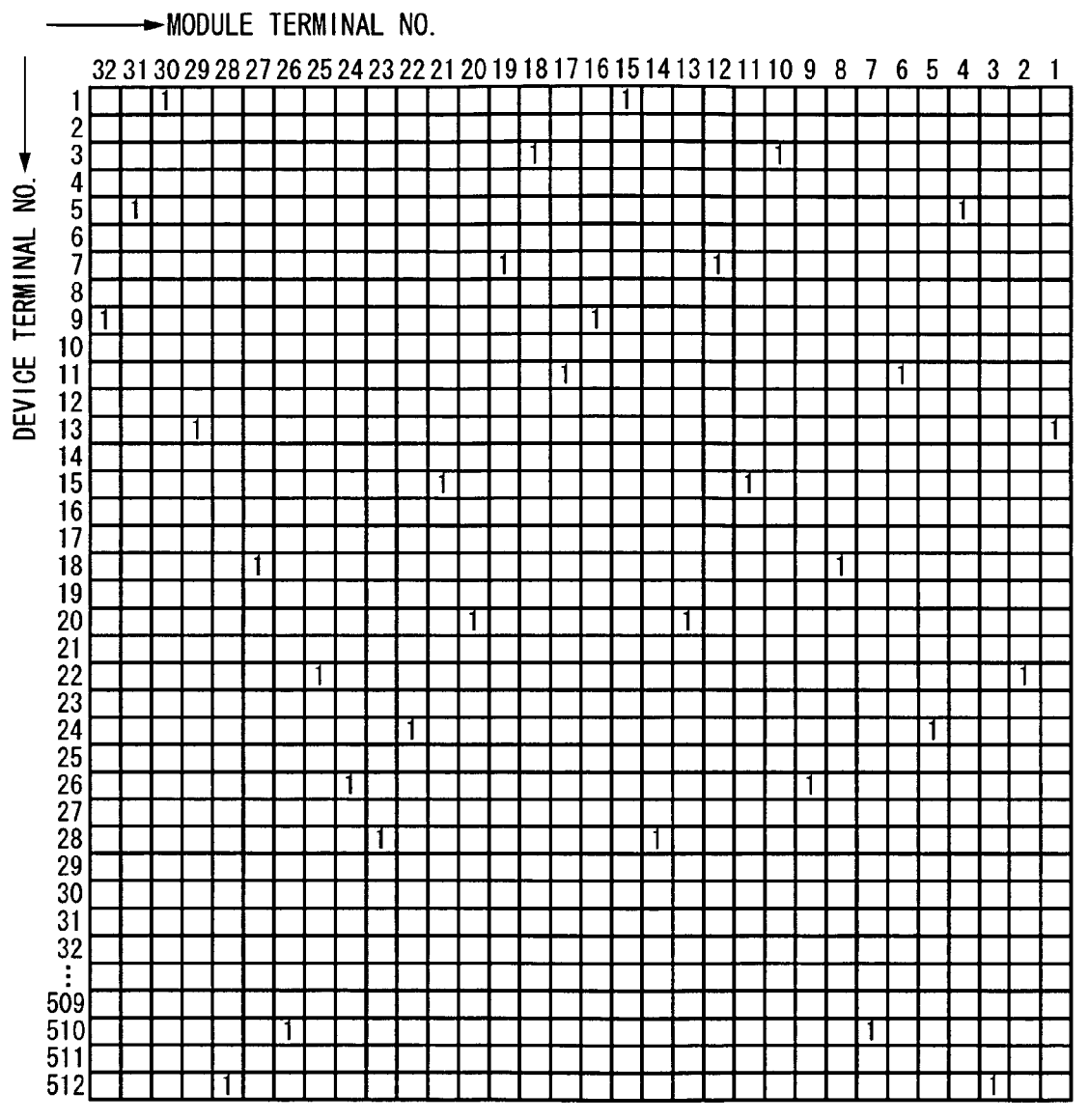

FIG. 6 shows an exemplary pin map stored in the terminal correspondence storing unit 304. In this example, each digital module 106 has 32 (n=32) module terminals 206 and each electronic device 50 has 512 device terminals 52.

The terminal correspondence storing unit 304 indicates, for each of device terminal numbers 1–512 that represent 512 device terminals 52, respectively, a module terminal number representing a module terminal 206 to be connected to that device terminal 52 by storing a value "1" in a filed corresponding to that module terminal number. For example, the terminal correspondence storing unit 304 stores a pin map that specifies two module terminals 206 having the module terminal numbers 15 and 30 for the device terminal 52 having the device terminal number 1. According to this example, correspondence between device terminals 52 and module terminals 206 can be stored in an appropriate manner.

The terminal correspondence storing unit 304 receives the pin map from the tester controller 102 (see FIG. 1) on start-up of the test device 100 and stores it therein. The tester controller 102 creates the pin map, for example, based on pin assign data indicating correspondence between device terminals 52 of each electronic device 50 and module terminals 206. The tester controller 102 creates the pin map by obtaining a logical sum of values corresponding to the same device terminal number for the respective electronic devices 50 in the pin assign data, for all the electronic device 50.

Figure 7:
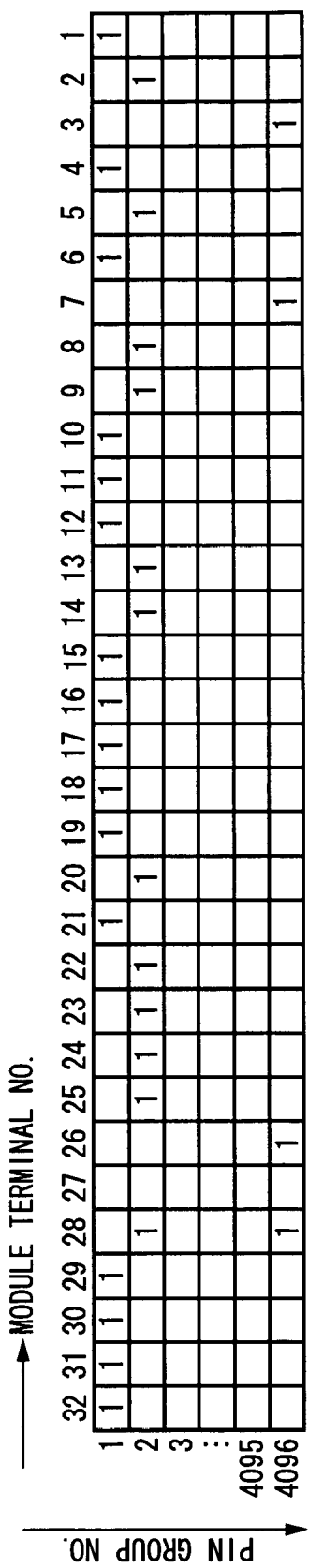
FIG. 7 shows an exemplary pin group map.

FIG. 7 shows an exemplary pin group map stored in the terminal correspondence storing unit 304. In this example, the tester controller 102 outputs an operating condition in such a manner that the operating condition is associated with any one of 4096 terminal groups.

The terminal correspondence storing unit 304 indicates, for each of pin group numbers 1–4096 representing the 4096 terminal groups, respectively, a module terminal number representing a module terminal 206 to be connected to a device terminal 52 included in that terminal group by storing a value "1" in a field corresponding to that module terminal number. For example, the terminal correspondence storing unit 304 stores a pin group map that specifies 16 module terminals 206 respectively having module terminal numbers 1, 4, 6, 10–12, 15–19, 21, and 29–32 for a terminal group having a pin group number 1. According to this example, an operating condition such as a common timing or a signal level can be efficiently broadcasted and set for a plurality of module terminals 206 corresponding to a terminal group.

Figure 8:
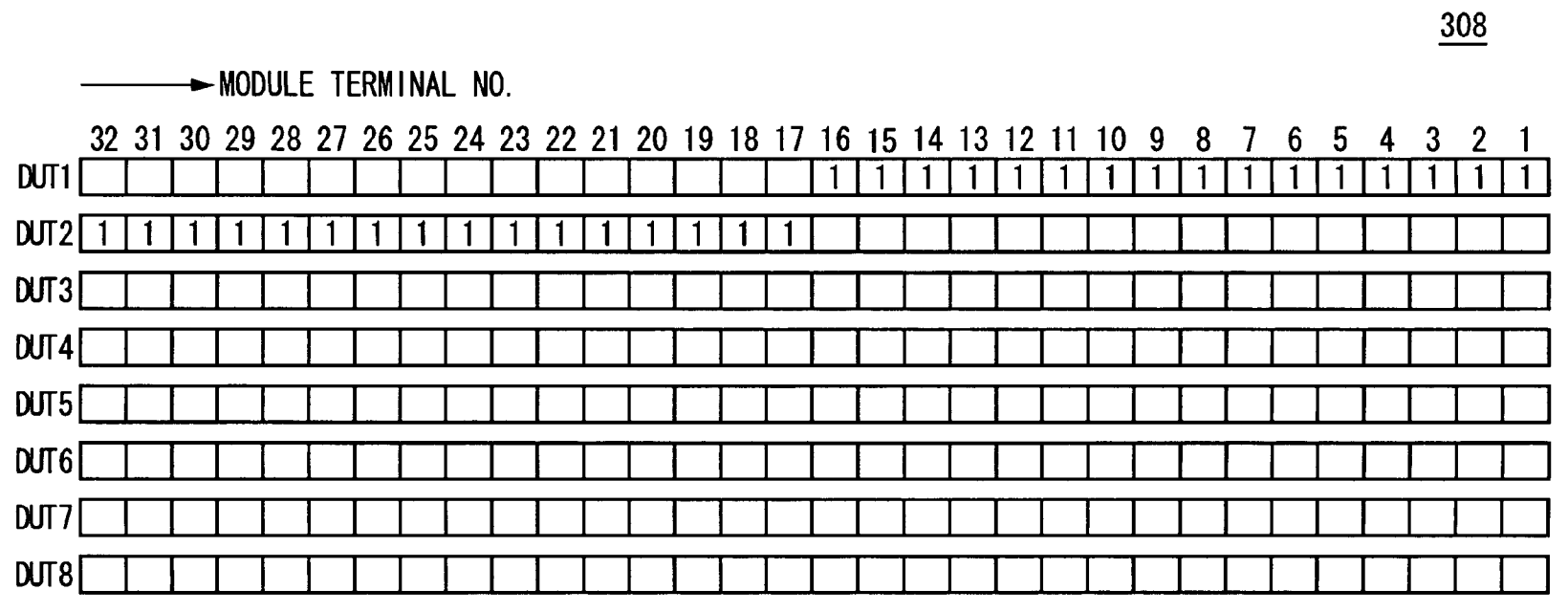

FIG. 8 shows an example of module-terminal information stored in the DUT map register 308. In this example, the test device 100 tests eight (p=8) electronic devices 50 (see FIG. 1) in parallel. Module terminals 206 of module terminal numbers 1–16 in the digital module 106 including this DUT map register 308 are connected to the first electronic device 50 (DUT1). Module terminals 206 of module terminal numbers 17–32 are connected to the second electronic device 50 (DUT2).

The DUT map register 308 corresponding to each of the first to eighth electronic devices 50 (DUT1–DUT8) indicates module-terminal information indicating a module terminal 206 connected to the corresponding electronic device 50 by storing a value "1" in a field of the module terminal number of that module terminal 206. For example, an individual device information storing unit 508 corresponding to the first electronic device 50 stores a value "1" in fields of the module terminal numbers 1–16. According to this example, it is possible to appropriately select a module terminal 206 that is connected to each electronic device 50 in each digital module 106.

Figure 9:
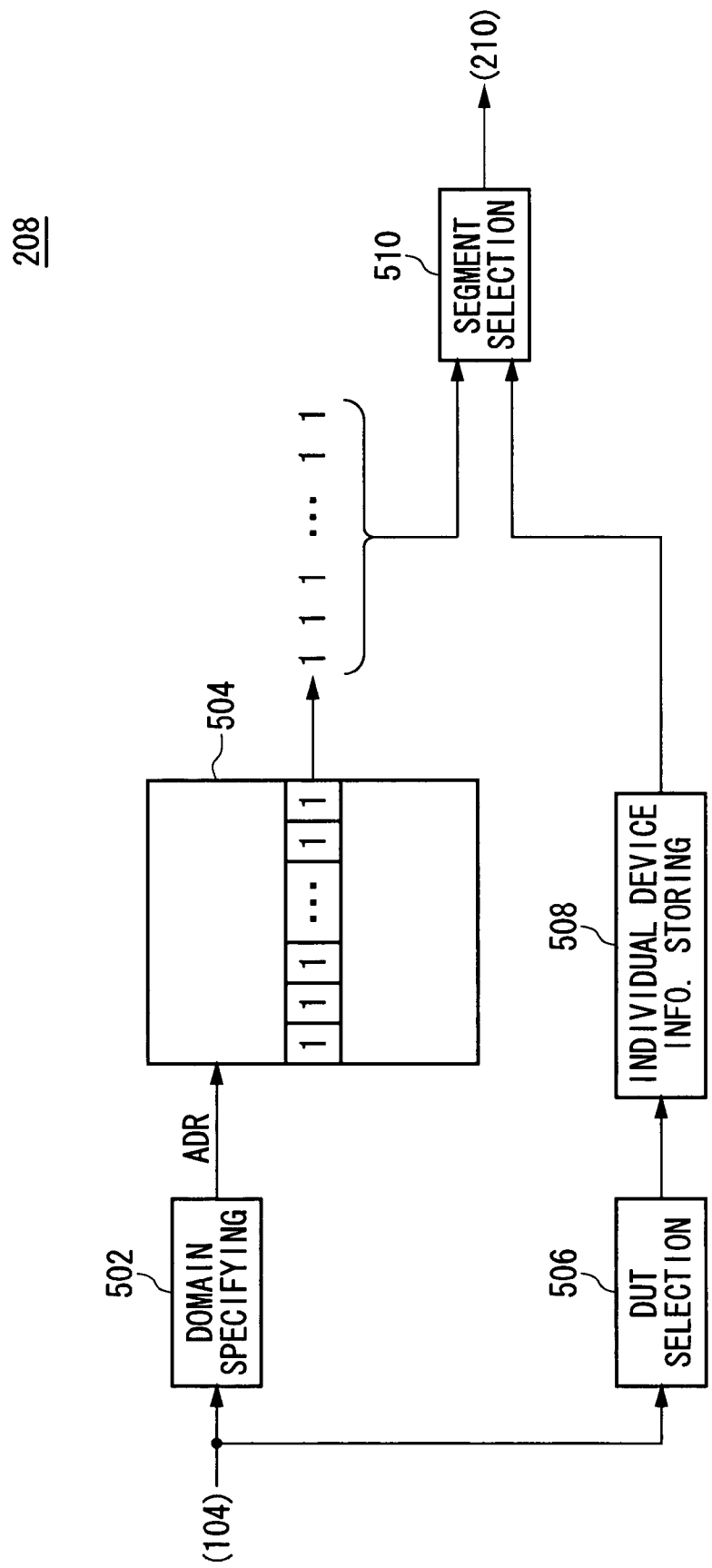
FIG. 9 illustrates an exemplary structure of a matrix setting unit 208.

FIG. 9 illustrates an exemplary structure of the matrix setting unit 208. The matrix setting unit 208 includes a domain specifying unit 502, a segment information storing unit 504, a DUT selection unit 506, an individual device information storing unit 508 and a segment selection unit 510.

As described above, the test device 100 (see FIG. 1) of this example has a function of testing an electronic device 50 (see FIG. 1) having a plurality of input and output interfaces, by using a plurality of signals having different frequencies (test rates). The test device 100 sets a plurality of domains including one or more segments 404 (see FIG. 5) for each electronic device 50 in advance, and sets timings based on different frequencies for the respective domains. A plurality of segments 404 included in each domain may be provided in different digital modules 106 (see FIG. 1). The tester controller 102 specifies an electronic device 50 and a domain that are to be tested for the matrix module 108.

The domain specifying unit 502 is an address decoder having the same or similar function as/to that of the device terminal selection unit 302 (see FIG. 2). The domain specifying unit 502 stores correspondence between each of a plurality of domains and an address to be output. The domain specifying unit 502 receives information indicating any of the domains from the tester controller 102 via the bus switch 104 (see FIG. 1) and supplies the address corresponding to that domain to the segment information storing unit 504.

The segment information storing unit 504 stores segment correspondence information indicating correspondence between each domain and a segment 404 connected to one or more device terminals 52 of that domain. The segment information storing unit 504 receives an address from the domain specifying unit 502 and supplies segment correspondence information indicating the segment 404 included in the domain corresponding to the received address to the segment selection unit 510. This segment correspondence information is a bit stream in which each segment is represented by one bit, for example. In this bit stream, a bit corresponding to the segment 404 included in the specified domain has a value "1" while a bit corresponding to the segment 404 that is not included in the specified domain as a value "0".

The DUT selection unit 506 has the same or similar function as/to that of the DUT selection unit 306 and supplies a signal indicating the electronic device 50 specified by the tester controller 102 to the individual device information storing unit 508. The individual device information storing unit 508 has the same or similar function as/to that of the individual device information storing unit 318 (see FIG. 3) except that information indicating the segment 404 is stored therein in place of information indicating the module terminal 206 (see FIG. 1). The individual device information storing unit 508 receives the signal from the DUT selection unit 506 and, in accordance with the received signal, supplies segment information indicating the segment 404 corresponding to the module terminal 206 that is to be connected to the electronic device 50 specified by the received signal, to the segment selection unit 510. The segment information is a bit stream in which each segment is represented by one bit, for example. In this bit stream, a bit corresponding to the segment. 404 connected to the specified electronic device 50 has a value "1" while a bit corresponding to the segment 404 that is not connected the specified electronic device 50 has a value "0".

The segment selection unit 510 selects the segment 404 corresponding to the electronic device 50 and domain that were specified by the tester controller 102, based on the segment correspondence information, that was stored in the segment information storing unit 504 to correspond to the specified domain, and the segment information that was stored in the individual device information storing unit 508 to correspond to the specified electronic device 50. Then, the segment selection unit 510 supplies a switching control signal indicating the selected segment 404 to the matrix switch unit 210. The segment selection unit 510 may obtain AND of the segment correspondence information received from the segment information storing unit 504 and the segment information received from the individual device information storing unit 508 for each bit and output the obtained AND as the switching control signal, for example. The matrix switch unit 210 sets a switching circuit for connecting a plurality of test units 204 (see FIG. 1) to each other, for example, based on the switching control signal. According to this example, the matrix switch unit 210 can be controlled appropriately.

Figure 10:
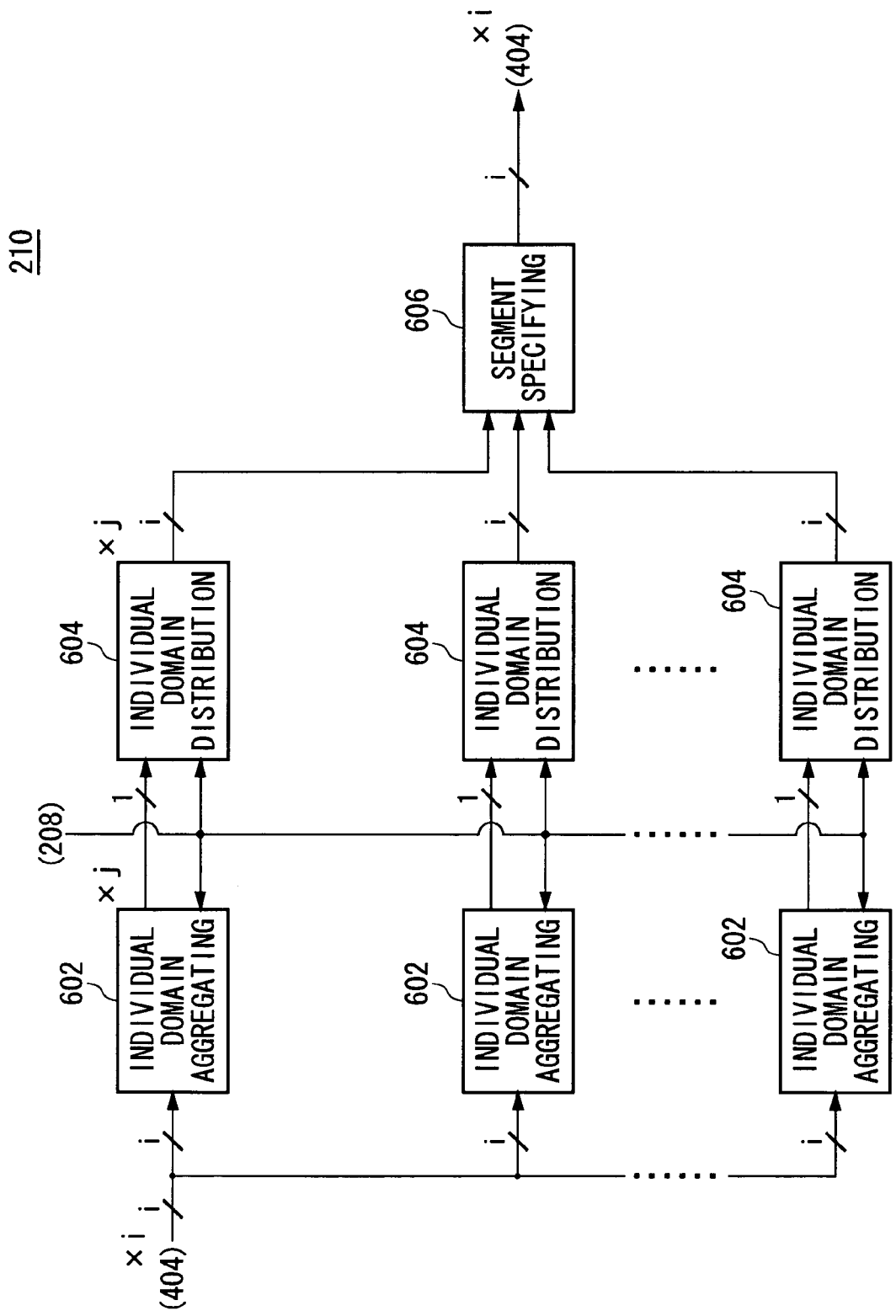
FIG. 10 illustrates an exemplary structure of a matrix switch unit 210.

FIG. 10 illustrates an exemplary structure of the matrix switch unit 210. In this example, the tester controller 102 (see FIG. 1) sets j domains. The matrix switch unit 210 includes j individual domain aggregating units 602 and j individual domain distribution units 604 that are provided to correspond to the j domains, respectively, and a segment specifying unit 606.

In this example, the test device 100 (see FIG. 1) has i segments 404 (see FIG. 5). The matrix switch unit 210 receives one-bit fail signals from the i segments 404.

Module terminals 206 of each segment 404 are electrically connected to any one of electronic devices 50. In a case where an electronic device 50 failed the test, the segment 404 corresponding to that electronic device 50 supplies a fail signal indicating that failure to the matrix switch unit 210.

Each individual domain aggregating unit 602 generates, based on fail signals for the respective module terminals 206 corresponding to the device terminals 52 included in the corresponding domain, a domain fail signal indicating that an output signal of any of the module terminals 206 that belong to the corresponding domain is not coincident with its expected value. The individual domain aggregating unit 602 of the present embodiment generates the domain fail signal based on fail signals input from the respective segments 404 connected to the device terminals 52 that belong to the corresponding domain.

More specifically, the individual domain aggregating unit 602 selects the fail signal corresponding to the segments 404 included in the corresponding domain, from an i-bit fail signal corresponding to i segments 404. Then, in a case where any of the selected fail signals indicates a failure, the individual domain aggregating unit 602 supplies a one-bit domain fail signal indicating that a failure occurs in the corresponding domain, to the associated individual domain distribution unit 604. In this manner, the individual domain aggregating unit 602 aggregates the fail signals received from the corresponding segments 404.

The individual domain distribution unit 604 distributes the domain fail signal generated by the individual domain aggregating unit 602 corresponding to that domain to respective digital modules 106 connected to the device terminals 52 of that domain. The individual domain distribution unit 604 of the present embodiment distributes the domain fail signal to the respective segments 404 connected to the module terminals 206 that belong to that domain.

More specifically, when receiving the domain fail signal indicating a failure of a certain domain from the associated individual domain aggregating unit 602, the individual domain distribution unit 604 outputs an i-bit bit stream of the domain fail signal in which a bit representing the segment 404 included in that domain is "1". The i bits of the bit stream of the domain fail signal correspond to the i segments 404, respectively. Thus, in a case where any segment 404 included in the corresponding domain output a fail signal, the individual domain distribution unit 604 outputs a domain fail signal having a value "1" to all the segments 404 included in the corresponding domain. In this manner, the individual domain distribution unit 604 can distribute the fail signal to the corresponding segments 404.

The segment specifying unit 606 obtains a logical sum of i-bit signals respectively output from j individual domain distribution unit 604 for each bit, and outputs the obtained logical sum. The individual domain distribution unit 604 supplies each bit of the i-bit signal indicating this logical sum to the corresponding one of the i segments 404.

Thus, in a case where any segment 404 output a fail signal, the matrix switch unit201 can notify a failure of all the segments 404 included in the same domain as that segment 404. The segment 404 received this notification may perform a failure process for that domain, for example, electrical disconnection of the corresponding electronic device 50 from the module terminal 206. According to this example, a plurality of domains can be managed in an appropriate manner.

In the above description, each of the individual domain aggregating unit 602 and individual domain distribution unit 604 sets a switching circuit, for example, in accordance with the corresponding domain based on the switching control signal received from the matrix setting unit 208. Thus, it is possible to the respective individual domain aggregating unit 602 and individual domain distribution unit 604 in such a manner that a fail signal can be supplied and received by the electronic device 50 specified by the tester controller 102 and the segment 404 corresponding to that domain.

Although the present invention has been described by way of exemplary embodiments, it should be understood that those skilled in the art might make many changes and substitutions without departing from the spirit and the scope of the present invention which is defined only by the appended claims.

According to the present invention, a test device can be provided at an appropriate cost.

What is claimed is:

1. A test device for testing an electronic device having a plurality of device terminals that receive a signal, comprising:

an operating condition outputting unit operable to output an operating condition indicating an operation of said signal to be supplied to a device terminal to be associated with said device terminal; and a test module operable to supply a test signal used in a test of said electronic device to said electronic device based on said operation indicated by said operating condition, wherein said test module includes:

a plurality of module terminals each of which is electrically connected to any of said device terminals, said module terminals being operable to supply said test signal to said device terminals, respectively;

a terminal correspondence storing unit operable to store terminal correspondence information indicating correspondence between said device terminals and said module terminals connected to said device terminals, respectively; and an operating setting unit operable to select a module terminal connected to said device terminal associated with said operating condition based on said terminal correspondence information and to set said operating condition for said selected module terminal.

2. A test device as claimed in claim 1, wherein said test device tests a plurality of electronic devices, said operating condition outputting unit specifies an electronic device that is connected to said module terminal for which said operating condition is to be set, said test module further includes an individual device information storing unit operable to store, for each of said plurality of electronic devices, module-terminal information indicating a module terminal connected to that electronic device, and said operating condition setting unit selects said module terminal that is connected to said device terminal associated with said operating condition in said electronic device specified by said operating condition outputting unit, based on said terminal correspondence information and said module-terminal information, and sets said operating condition for said selected module terminal.

3. A test device as claimed in claim 2, wherein said operating condition outputting unit outputs said operating condition to be associated with a terminal group that is a group of a plurality of device terminals, said terminal correspondence storing unit stores information indicating correspondence said terminal group and a module terminal that is connected to a device terminal included in said terminal group as said terminal correspondence information, and said operating condition setting unit selects said module terminal that is connected to said device terminal included in said terminal group associated with said operating condition based on said terminal correspondence information, and, in a case where said selected module terminal is connected to said electronic device specified by said operating condition outputting unit, sets said operating condition for said selected module terminal.

4. A test device for testing an electronic device having a plurality of device terminals operable to output signals, comprising:

an operating condition outputting unit operable to output an operating condition indicating an expected value of a signal output from a device terminal to be associated with said device terminal; and a test module operable to compare the output signal of said electronic device with said expected value indicated by said operating condition, wherein said test module includes:

a plurality of module terminals each of which is electrically connected to any of said device terminals, said plurality of module terminals being operable to input said signals output from said device terminals, respectively;

a terminal correspondence storing unit operable to store terminal correspondence information indicating correspondence between each of said device terminals and a module terminal connected to said each device terminal; and an operating condition setting unit operable to select a module terminal that is connected to said device terminal associated with said operating condition based on said terminal correspondence information and to set said operating condition as said expected value of said output signal of said device terminal that is input from said selected module terminal.

5. A test device as claimed in claim 4, wherein each of said plurality of device terminals of said electronic device belongs to any of a plurality of domains, said test device includes said operating condition outputting unit, a plurality of said test modules and a matrix module operable to connect said plurality of test modules, each of said plurality of test modules further includes a test unit operable to output a fail signal indicating that said output signal input from said module terminal of that test module is inconsistent with its expected value, to said matrix module, said matrix module includes:

a plurality of individual domain aggregating units provided for said plurality of domains, respectively, each individual domain aggregating unit being operable to generate a domain fail signal indicating for at least one module terminal of a corresponding domain said output signal and its expected value are inconsistent with each other, based on said fail signal for each of said module terminals respectively corresponding to said device terminals of said corresponding domain; and a plurality of individual domain distribution units provided for said plurality of domains, respectively, each individual domain distribution unit being operable to distribute said domain fail signal generated by said individual domain aggregating unit of a corresponding domain to each of said test modules connected to said test devices of said corresponding domain.

6. A test device as claimed in claim 5, wherein each of said test modules performs a failure process for said electronic device in a domain when receiving said domain fail signal for that domain.

7. A test device as claimed in claim 5, wherein said test unit of each of said test modules includes a plurality of segments each of which outputs said fail signal to said matrix module in a case where for any of two or more module terminals connected to two or more device terminals of the same domain said output signal and its expected value are inconsistent with each other, said each individual domain aggregating unit generates said domain fail signal based on said fail signal input from each of said segments connected to said device terminals of said corresponding domain, and said each individual domain distribution unit distributes said domain fail signal generated by said individual domain aggregating unit corresponding to said corresponding domain to each said segments connected to said device terminals of said corresponding domain.

8. A test device as claimed in claim 7, wherein said test device tests a plurality of electronic devices, said operating condition outputting unit specifies an electronic device and a domain that are to be tested, said matrix module includes:

a segment information storing unit operable to store segment correspondence information indicating correspondence between each of said domains and a segment connected to said device terminal of said each domain;

an individual device information storing unit operable to store segment information indicating for each of said plurality of electronic devices a segment to be connected to said each electronic device; and a segment selection unit operable to selects a segment corresponding to said electronic device and said domain that were specified by said operating condition outputting unit, based on said segment correspondence information that was stored in said segment information storing unit to correspond to said specified domain and said segment information that was stored in said individual device information storing unit to correspond to said specified electronic device, said individual domain aggregating unit generates said domain fail signal based on said fail signal input from said segment selected by said segment selection unit, and said individual domain distribution unit distributes said domain fail signal to said segment selected by said segment selection unit.

9. A test device for testing a plurality of electronic devices each having a plurality of device terminals for receiving signals, comprising:

an operating condition outputting unit operable to output an operating condition indicating an operation of a test signal used in a test of said electronic devices in a case where said test signal is supplied to a device terminal, while making said operating condition correspond to said device terminal and specifying an electronic device that is to be connected to a module terminal for which said operating condition is set;

a plurality of module terminals each of which is electrically connected any of said device terminals, each module terminal supplying said test signal to a corresponding device terminal;

a terminal correspondence storing unit operable to store terminal correspondence information indicating correspondence between each of said device terminals and a module terminal to be connected to said each device terminal;

an individual device information storing unit operable to store, for each of said plurality of electronic devices, store module-terminal information indicating a module terminal connected to said each electronic device; and an operating condition setting unit operable to select a module terminal that is connected to said device terminal associated with said operating condition in said electronic device specified by said operating condition outputting unit based on said terminal correspondence information and said module-terminal information, and to set said operating condition for said selected module terminal.

10. A test device for testing a plurality of electronic devices each having a plurality of device terminals for outputting signals, comprising:

an operating condition outputting unit operable to output an operating condition indicating an expected value of an output signal output from one of said electronic devices, while making said operating condition correspond to a device terminal and specifying said one electronic device that is to be connected to a module terminal for which said operating condition is set;

a plurality of module terminals each of which is electrically connected to any one of said device terminals, said plurality of module terminals inputting signals output from said device terminals, respectively;

a terminal correspondence storing unit operable to store terminal correspondence information indicating correspondence between each of said device terminals and a module terminal connected to said each of said device terminals;

an individual device information storing unit operable to store, for each of said plurality of electronic devices, module-terminal information indicating a module terminal to be connected to said each of said plurality of electronic devices; and an operating condition setting unit operable to select said module terminal connected to said device terminal associated with said operating condition in said electronic device specified by said operating condition outputting unit based on said terminal correspondence information and said module-terminal information and to set said operating condition for said selected module terminal.

11. A test module for supplying a test signal used in a test of an electronic device having a plurality of device terminals for receiving a signal, to said electronic device, comprising:

a plurality of module terminals each of which is electrically connected to any of said device terminals, said plurality of module terminals supplying said test signal to said device terminals, respectively;

a terminal correspondence storage unit operable to store terminal correspondence information indicating correspondence between each of said device terminals and a module terminal connected to said each of said device terminals; and an operating condition setting unit operable to receive an operating condition indicating an operation of said test signal that is supplied to said electronic device in such a manner that said operating condition is associated with a device terminal, select a module terminal connected to said device terminal associated with said operating condition based on said terminal correspondence information, and set said operating condition for said selected module terminal.

12. A test module for comparing an output signal of an electronic device having a plurality of device terminals for outputting signals with an expected value, comprising:

a plurality of module terminals each of which is electrically connected to any of said device terminals, said plurality of module terminals inputting said signals output from said device terminals, respectively;

a terminal correspondence storing unit operable to store terminal correspondence information indicating correspondence between each of said device terminals and a module terminal connected to said each of said device terminals; and an operating condition setting unit operable to receive an operating condition indicating said expected value of said output signal of said electronic device in such a manner that said operating condition is associated with a device terminal, select a module terminal connected to said device terminal associated with said operating condition based on said terminal correspondence information and set said operating condition as an expected value of said output signal input from said selected module terminal.

* * * * *